United States Patent
Tsironis

(10) Patent No.: US 12,512,807 B1
(45) Date of Patent: Dec. 30, 2025

(54) PRE-MATCHED HYBRID LOAD PULL TUNER FOR MODULATED SIGNAL AND METHOD

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 172 days.

(21) Appl. No.: 18/375,083

(22) Filed: Sep. 29, 2023

(51) Int. Cl.
| | |
|---|---|
| *H03H 7/38* | (2006.01) |
| *G01R 27/32* | (2006.01) |
| *G01R 31/28* | (2006.01) |
| *H01P 5/04* | (2006.01) |

(52) U.S. Cl.
CPC .............. *H03H 7/38* (2013.01); *G01R 27/32* (2013.01); *G01R 31/2822* (2013.01); *H01P 5/04* (2013.01)

(58) Field of Classification Search
CPC ....... H01P 5/04; G01R 31/2822; G01R 27/32; H03H 7/38
USPC ............................ 333/1.1, 20, 24 R, 109–112
See application file for complete search history.

(56) References Cited

U.S. PATENT DOCUMENTS

| | | |
|---|---|---|
| 6,509,743 B1 | 1/2003 | Ferrero |
| 6,674,293 B1 | 1/2004 | Tsironis |
| 7,135,941 B1 | 11/2006 | Tsironis |
| 7,816,926 B2 | 10/2010 | Benedikt et al. |
| 9,625,556 B1 | 4/2017 | Tsironis |
| 9,921,253 B1 | 3/2018 | Tsironis |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
"Computer Controlled Microwave Tuner—CCMT", Product Note 41, Focus Microwaves Inc., Jan. 1998.
"ALPS Active Load Pull System", Product Note 33, Focus Microwaves, Apr. 1996.
Field-programmable gate array—FPGA [online], Wikipedia [Retrieved on Mar. 15, 2018] Retrieved from Internet <URL:wikipedia.org/wiki/Field-programmable_gate_array>.

*Primary Examiner* — Rakesh B Patel

(57) ABSTRACT

An improved pre-matched active modulated tuner is used for hybrid load pull testing microwave transistors subject to modulated signal stimulus. A modulation pattern correction method uses calibration data of a pre-matching passive slide screw tuner to modify the data management of the numeric processor of the active tuner and allows lower power requirement of the active tuner and precise target tuning using optimization with a realistic starting point.

5 Claims, 9 Drawing Sheets

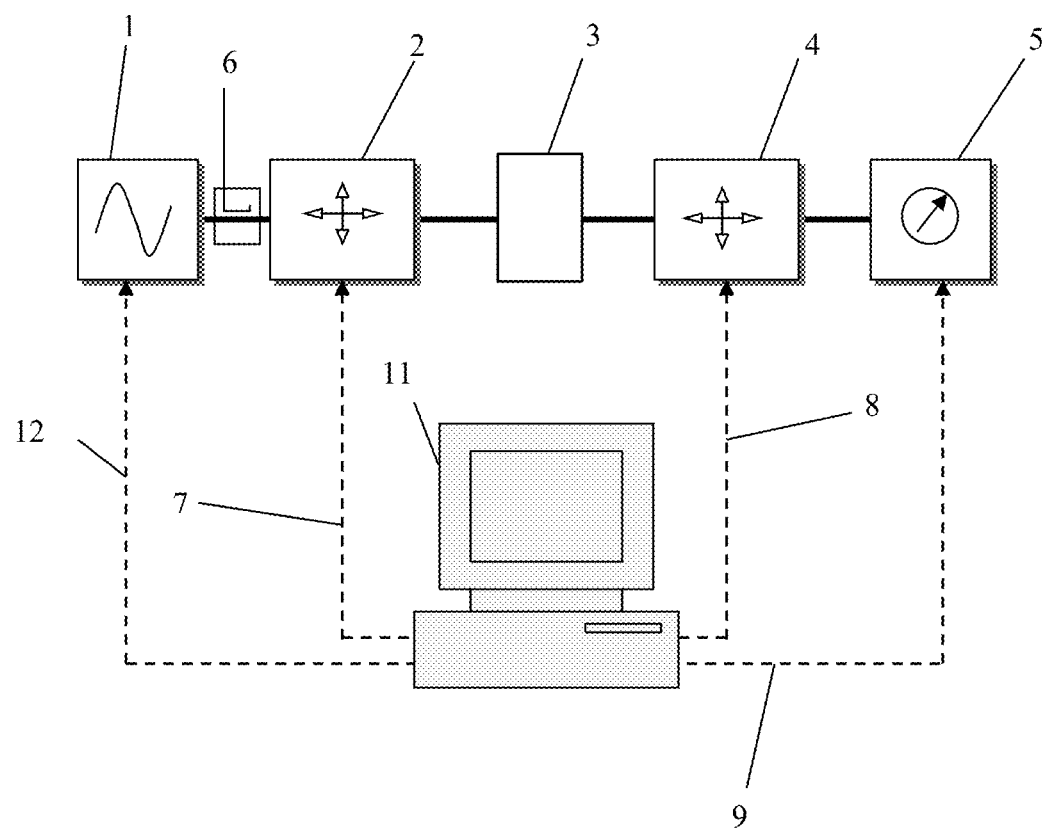
FIG. 1: Prior art

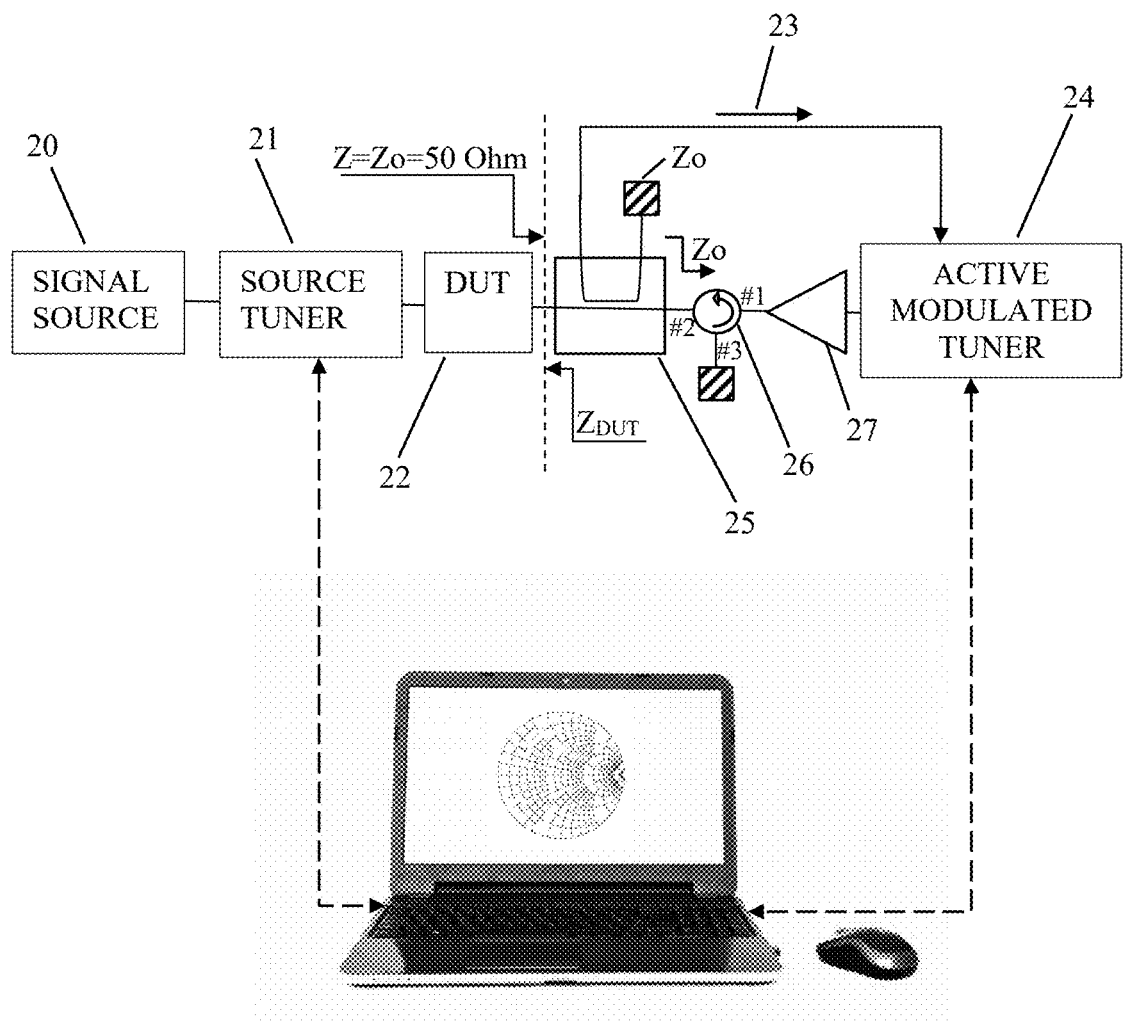
FIG. 2: Prior art

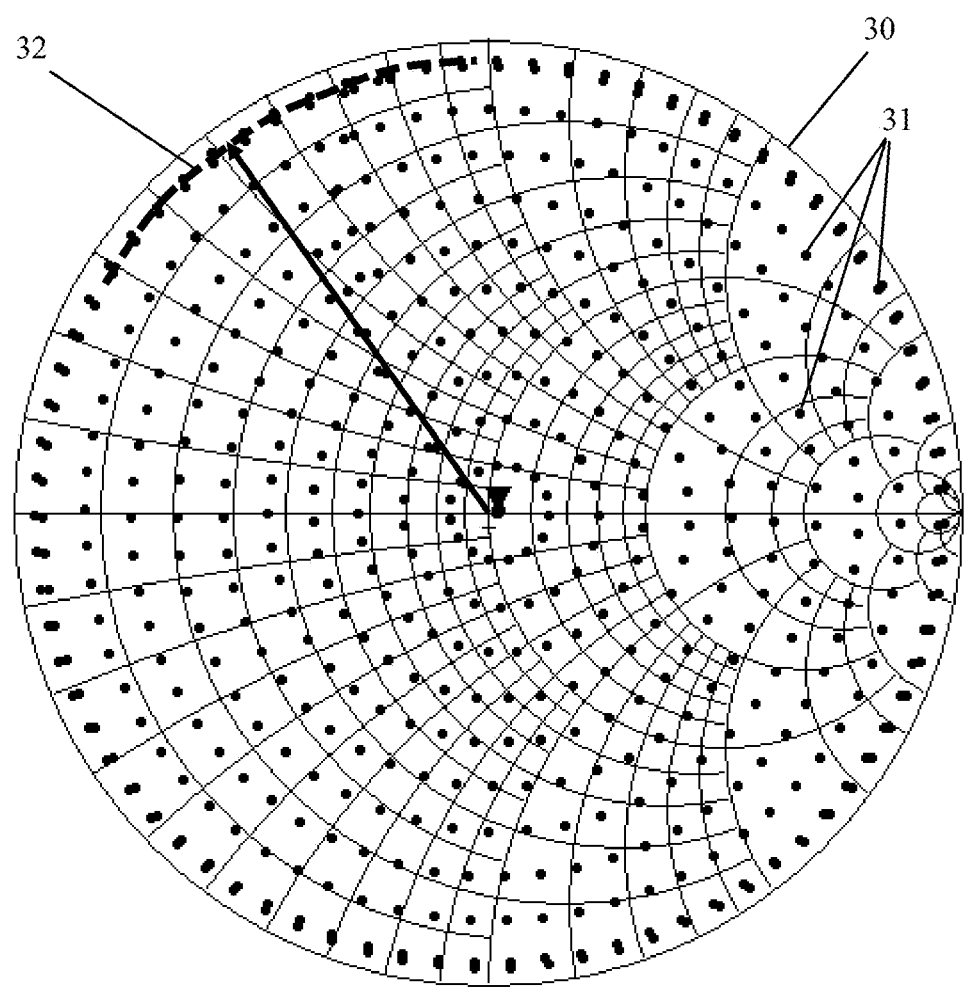
FIG. 3: Prior art

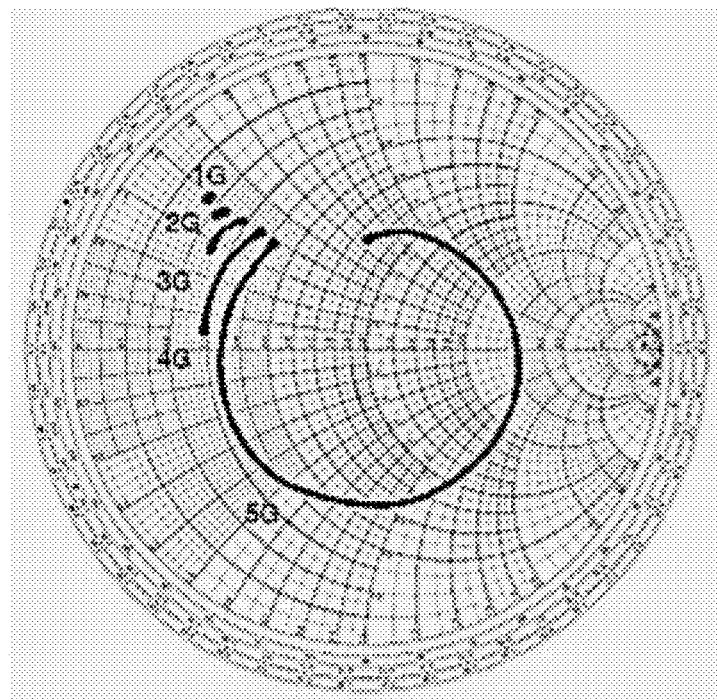
FIG. 4: Prior art

FIG. 5A: Prior art
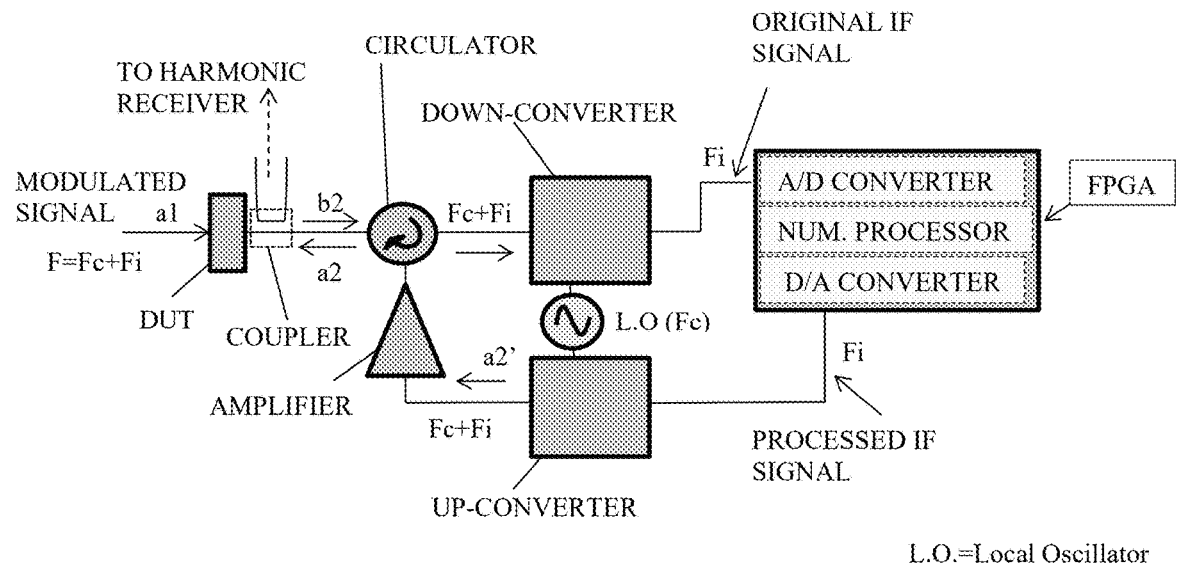
FIG. 5B: Prior art
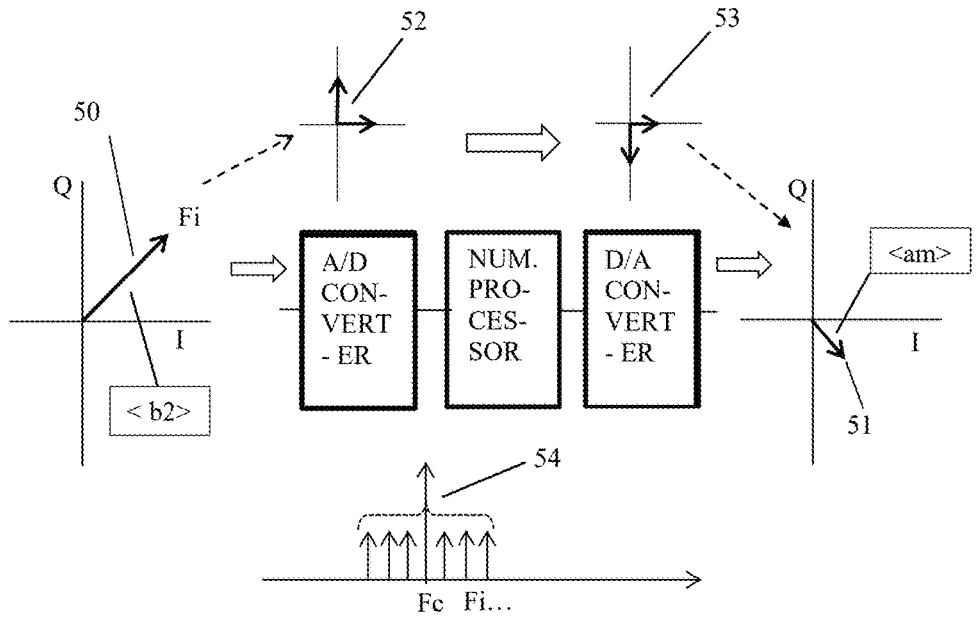
L.O.=Local Oscillator

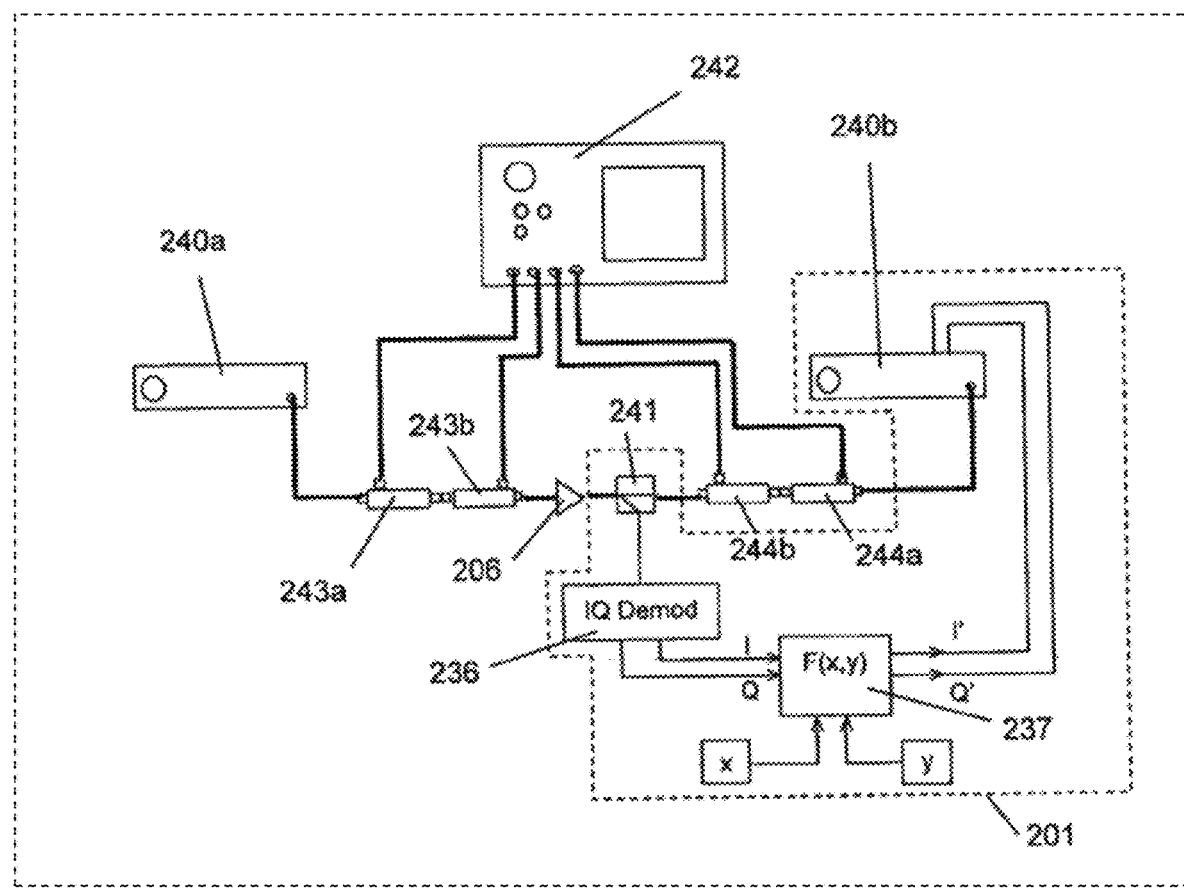
FIG. 9: Prior art

PRE-MATCHED HYBRID LOAD PULL TUNER FOR MODULATED SIGNAL AND METHOD

PRIORITY CLAIM

Not applicable

CROSS-REFERENCE TO RELATED ARTICLES

1. Load Pull, [online], Wikipedia [Retrieved on Nov. 18, 2016] Retrieved from Internet <URL: wikipedia.org/wiki/Load_pull>
2. "Computer Controlled Microwave Tuner—CCMT," Product Note 41, Focus Microwaves Inc., January 1998.
3. "ALPS Active Load Pull System", Product Note 33, Focus Microwaves, April 1996.
4. Tsironis, C, U.S. Pat. No. 9,921,253, "Method for reducing power requirements in active load pull system".
5. Tsironis, C, U.S. Pat. No. 6,674,293, "Adaptable pre-matched tuner system and method".
6. Benedikt, J, et al., U.S. Pat. No. 7,816,926, "High frequency circuit analyzer".
7. Field-programmable gate array-FPGA [online], Wikipedia [Retrieved on Mar. 15, 2018] Retrieved from Internet <URL: wikipedia.org/wiki/Field-programmable_gate_array>.
8. Ferrero A., U.S. Pat. No. 6,509,743, "Active load or source impedance synthesis apparatus for measurement test set of microwave components and systems."
9. Tsironis, C., U.S. Pat. No. 9,625,556, "Method for calibration and tuning with impedance tuners".
10. Tsironis, C., U.S. Pat. No. 7,135,941, "Triple probe automatic slide screw load pull tuner and method".

BACKGROUND OF THE INVENTION

This invention relates to microwave (RF) frequency load and source pull testing of medium and high-power RF transistor chips, especially on-wafer, using remotely controlled hybrid (active and passive) impedance tuners. Modern design of high-power RF amplifiers, used in various communication systems, requires accurate knowledge of the active device's (microwave transistor's, device under test, DUT) characteristics. In such circuits, it is insufficient for the transistors, which operate in their highly non-linear regime close to power saturation, to be described using marginally accurate large signal non-linear numeric models.

A popular method for testing and characterizing such microwave components (transistors) in the non-linear region of operation is "load pull" (see ref. 1). Load pull is a measurement technique employing RF impedance tuners and other test equipment as shown in FIG. 1. The tuners 2 and 4 are used in order to manipulate the microwave impedance conditions under which the DUT 3 is tested; the signal is provided by a signal source 1 and the outcoming power is measured by a coupler 6 and a power meter 5; the whole is controlled by a PC 11, which communicates with and controls the instruments and the tuners using digital control cables 7, 8, 9 and 12.

There exist two types of tuners: passive and active. Passive tuners use a physical obstacle (tuning probe) to reflect part of the signal back to the DUT, creating a physical load, whereas active tuners inject into the output of the DUT a signal, synchronous with the signal traversing the DUT albeit with user-controlled amplitude and phase, creating a virtual load. Passive tuners use the slide screw concept employing a single tuning probe (see ref. 2) or multiple tuning probes (see ref. 10); active tuners use either external synchronized signal sources (see ref. 4) or feedback loops (see ref. 3 and 8).

Hybrid tuners include an active tuner and a passive tuner: the active tuner injects a synchronized signal with adjustable power into the DUT and may compensate for the insertion loss of the setup, which reduces the tuning range (maximum reflection factor, 32 on FIG. 3) of a passive tuner; the passive tuner 64 (FIG. 6) is a pre-matching impedance transformer, transfers the signal 23 coming from the output port of the coupler 60 and creates a pre-matching condition between the Zo=50 Ohm internal impedance of the active tuner (FIGS. 2 and 6) and the (typically) low (1-3 Ohm) output internal impedance $Z_{DUT}$ of the DUT, i.e., it reduces by a large factor the power requirement to the active tuner (see ref. 5) which is supplied by the amplifier 65.

In all above-mentioned cases, the main signal source 20 may emit a single tone or a modulated signal, which is required for multi-channel transmit-receive operations; this signal is, in general, modulated as defined by a modulation matrix or pattern, in which each of 2N+1 frequency components Fi around a center frequency Fc spaced by a frequency step dF or ΔF, is independently controlled in amplitude and phase. This modulation matrix, specific to a given communication device and protocol, includes information on amplitude and phase of each frequency component Fi in the modulation band and is called thereafter modulation pattern. This modulation pattern can be emulated or modified by the active modulated tuner used here forth (see ref. 6). The frequency change associated with the modulated signal causes a phase change in the reflection factor $\Gamma=|\Gamma|*\exp(j\Phi)$ created by a matching network presented to the DUT or by the slide screw passive tuner.

The reflection factor changes at each frequency Fi of the modulated signal, caused by a slide screw tuner, is called herein pattern deformation or distortion; in the case of single probe slide screw tuners (see ref. 2), the amplitude |Γ| of the reflection factor changes very little but the phase Φ changes significantly; this change can be calculated as $\Delta\Phi(°)=-0.024*L_{el}(cm)*\Delta F(MHz)$. $L_{el}$ is the electrical length of the section between the DUT and the tuning probe of the tuner and ΔF is the frequency deviation from Fc. This phase change is called herein "phase skewing" (FIG. 4, 7). An example of such phase skewing is shown as item 71 in FIG. 7. The result is an uncertainty in the test conditions, i.e., knowledge of the exact impedance (reflection factor) under which the DUT being evaluated when subjected to a modulated signal. In the case of multi-probe slide screw impedance tuners (see ref. 10) the reflection factor change inside the modulation band is much more complex and cannot be estimated using a formula: the changes in both amplitude and phase can only be captured using full tuner calibration and interpolation techniques (see ref. 9).

To compensate for this reflection factor skewing uncertainty, we use programmable active tuners, see ref. 6 and FIGS. 5A and 5B. These active tuners down-convert the modulated RF signal into a low MHz range, digitize it using analog to digital (A/D) converter, modify its components numerically in a field-programmable-gate-array (FPGA, see ref. 6, 7), convert it back to analog using a digital to analog (D/A) converter and up-convert it to the original frequency, with free controllable amplitude and phase of each Fi component; this up-converted signal is then injected, after a number of RF signal periods, back into the DUT. This allows redressing arbitrary skewed reflection factor points 71 and create a small cloud of skew-free load reflection factors 70 with quasi constant phase and amplitude over the whole modulation band Fc−N*dF to Fc+N*dF (FIG. 7).

However, without passive pre-matching, as shown in FIG. 2, the power requirement to the active tuner to cope with the high impedance mismatch of Zo versus $Z_{DUT}$ (typically between 20:1 and 50:1) is high. If we insert a passive pre-matching tuner 64 between the DUT and the active tuner, as shown in FIG. 6, then this will reduce the power requirement to the amplifier 65 by a significant factor of 10 or more; however, since the tuner 64 has a given, but unknown, if not calibrated, frequency-dependent reflect/ transfer behavior, this will also falsify the original programming of the numeric processor in the active tuner (FPGA, see ref. 7) required to move from skewed trace 71 to cloud 70. This must be considered and corrected. This is the purpose of this invention.

DESCRIPTION OF PRIOR ART

In the traditional passive load pull systems (FIG. 1) the DUT's characteristics are measured as a function of source and load impedances generated by the tuners 2 and 4 at the operating (carrier wave Fc−CW, fundamental, Fo) frequency and a number of harmonic frequencies (2Fo, 3Fo . . . ). An active tuner replaces a passive tuner in a similar configuration (FIG. 2); The signal source 20 can be either continuous wave (CW) or modulated. If it is modulated, the components of the modulated signal are altered by the frequency dependence of the tuners, because the tuners have frequency-dependent transmission and reflection behavior. Modulated signals create an uncertainty by any non-wideband components, such as filters, matching networks and tuners 21. This means the impedance presented to the DUT is known only for the center frequency Fc and unknown for all the other frequencies of the modulation band. If the modulation bandwidth is small (see case 1G in FIG. 4) and the electrical distance of the tuner to the DUT is also small, then it can be assumed that the reflection factor is constant over the modulation band. If not, then a different type of active tuner is required (see ref. 6 and FIG. 2); in this case the outgoing signal from the DUT 22 feeds information, through a coupler 25, to the active tuner 24, which processes it, generates a feedback signal and injects it via the circulator 26 back into the DUT; a programmable active tuner 24 as shown in FIGS. 5A and 5B is capable of shrinking the spread spectrum 71, created by the modulated signal, and create a fairly constant reflection factor 70 (FIG. 7) over the modulation bandwidth.

BRIEF DESCRIPTION OF THE DRAWINGS

The invention and its mode of operation will be more clearly understood from the following detailed description when read with the appended drawings in which:

FIG. 1 depicts prior art, a typical automated load pull test setup using passive tuners.

FIG. 2 depicts prior art, a typical automated load pull test setup using passive source tuner and active load tuner.

FIG. 3 depicts prior art, typical reflection factor coverage of a passive slide screw tuner.

FIG. 4 depicts prior art, typical bandwidth and phase spread (skewing) caused by various mobile phone modulation standards and passive tuners.

FIGS. 5A through 5B depict prior art, the signal flow mechanism of an active modulated tuner; FIG. 5A depicts the block diagram and signal flow; FIG. 5B depicts the signal decomposition and numeric processing.

FIG. 9 depicts prior art, the overall, modulated active tuner based, load pull test setup using in-situ real time impedance measurement.

SUMMARY OF THE INVENTION

Figure 6:
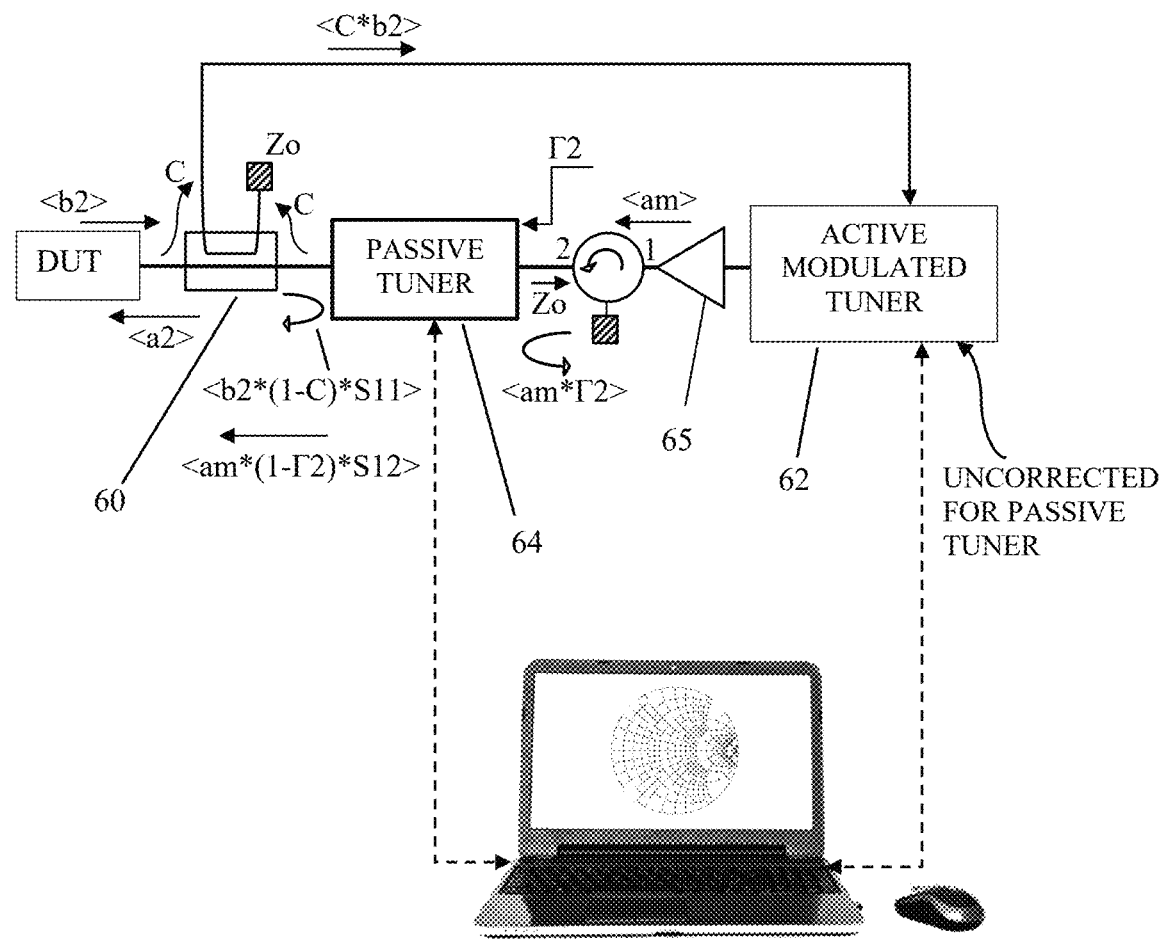
FIG. 6 depicts the pre-matched active modulated tuner with un-corrected modulation pattern <am> creating skewed reflection factor trace 73.

The reflection factors 31 in FIG. 3, created by the passive, slide screw impedance tuners, cover typically the largest part of the reflection factor plan (Smith chart) 30; FIG. 3 shows typical calibration points, whereby using appropriate tuning and interpolation algorithms (see ref. 9) a quasi-infinity (several millions) points can be tuned-to between the calibration points and allow creating almost every impedance within the tuning range 32 of the tuner; all the impedances (reflection factors) shown in FIG. 3 are valid at the tuner calibration frequency only, typically at the fundamental frequency Fo or modulation center frequency Fc (FIG. 5B). The reflection factor $\Gamma=|\Gamma|*\exp(j\Phi)$, created by a slide screw passive tuner, changes with frequency. Whereas the amplitude $|\Gamma|$ is, for small and moderate frequency changes, using single probe tuners, $\Delta F \ll Fc$ quasi-constant, the phase (does change, under circumstances significantly. The change in $\Phi$ (depends on $\Delta F$ and the electrical length $L_{el}$ of the transmission section connecting the DUT and the tuning probe (slug) of the tuner as follows: $\Delta\Phi(\deg)=-0.024*L(cm)*\Delta F(MHz)$. For a typical $L_{el} \approx 10$ cm and a typical $\Delta F \approx 50$ MHz this yields $\Delta\Phi \approx -12$ degrees. In fact, the electrical length, because of the use of dielectrically loaded cables, can easily exceed 10 cm and state of the art modulation bandwidths can exceed 100 MHz, (FIG. 4), in which case the phase change (skewing) can easily reach or exceed 50 degrees. Such uncontrolled dispersion in the target impedance is unacceptable.

Figure 7:
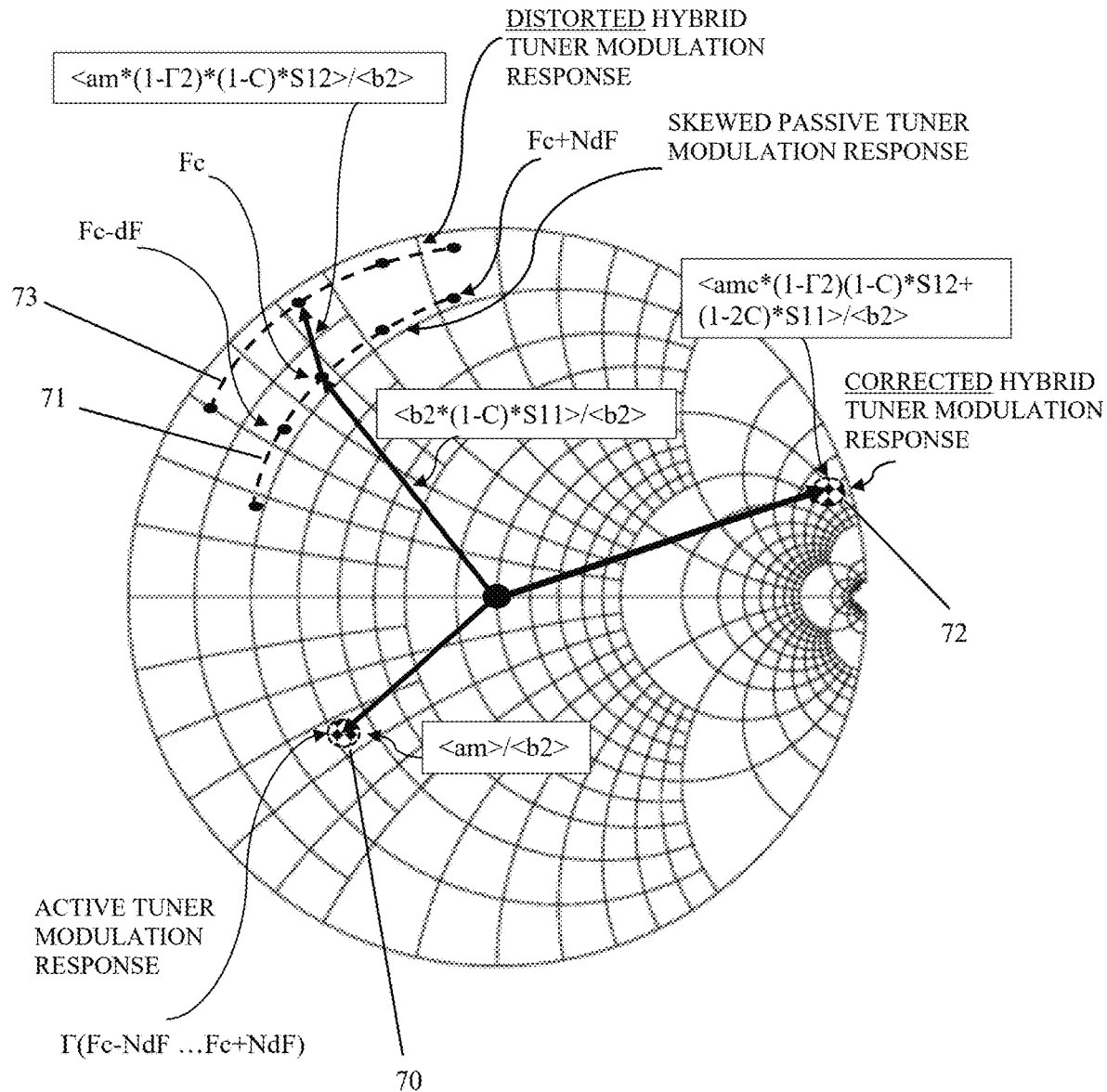
FIG. 7 depicts the reflection factors created by the directly reflected and the feedback signals using the pre-matched active modulated tuner.

It is significant to notice that the phase dispersion does not depend on the actual center frequency Fc itself, it only depends on the physical distance of the tuner from the DUT and the modulation bandwidth $\Delta F$. The modulated active tuning system shown in FIG. 5A (see ref. 6) can, as mentioned before, synthesize instantaneous reflection factors at will, using complex de-modulation/modulation and numeric processing strategies. However, in order to protect the amplifier 27 from returning signal power, a 50 Ohm circulator 26 is used, which is heavily mismatched against the DUT, which has a typical output impedance of 0.5 to 2 Ohms (50 Ohm>>$Z_{DUT}$), see FIGS. 2 and 6; this requires the use of a pre-matching tuner 64; the frequency response of both the reflection factor (S11) and the transmission factor (S12) of the tuner 64 distorts (deforms) the original modulation pattern <am> of the active tuner 62 created for a setup of FIG. 2, where no pre-matching tuner (like tuner 64) was used; correcting for this deformation and re-establishing control of the reflection factor spread from trace 73 to the small reflection factor cloud 72, shown in FIG. 7, is possible by embedding (cascading with the s-parameters {Sij} of the pre-matching passive tuner 64, using the formula $\Gamma\text{dist}=S11+(S12*S21\Gamma\text{orig})/(1-S22*\Gamma\text{orig})$, wherein $\Gamma_{dist}$ is the deformed (distorted) reflection factor, Γorig is the original reflection factor) into the numeric data processing of the active tuner, to allow re-programming the modulation pattern. In FIG. 6 this is not yet implemented, leading to the spread impedance trace 73, created using the original uncorrected modulation pattern <am>. Injecting the tuner s-parameters {Sij} into the active tuner and re-programming the numeric processor FPGA allows redressing the situation and creating the impedance cloud 72.

DETAILED DESCRIPTION OF THE INVENTION

Figure 8:
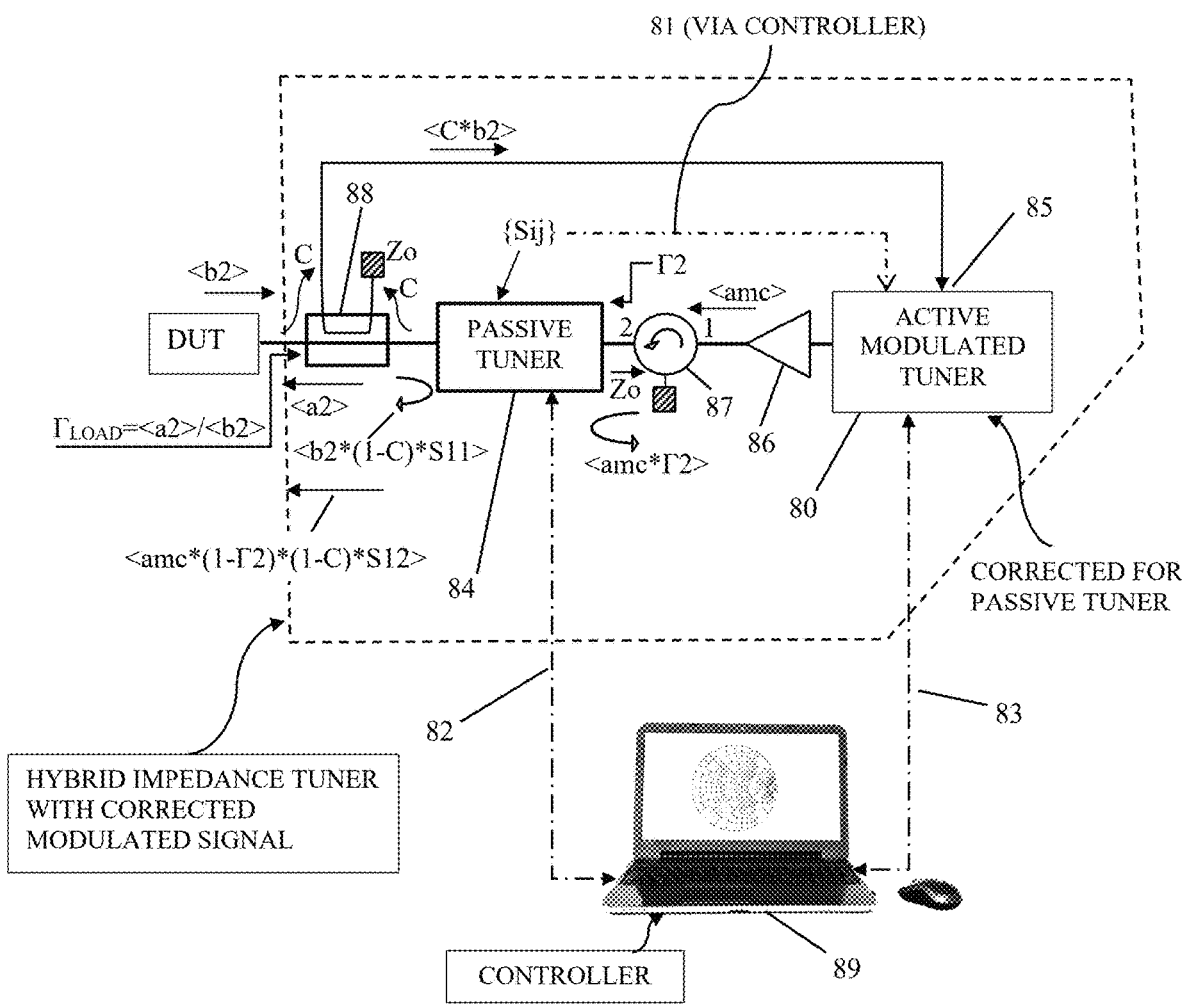
FIG. 8 depicts the pre-matched active (hybrid) modulated tuner with corrected modulation pattern <amc> capable of creating reflection factor cluster 72.

The schematic flow of signal power travelling waves <a>, <b> etc., shown in FIGS. 6 and 8, visualize the tuning procedure: In FIG. 6 a pre-matching tuner 64 has been added to the setup of FIG. 2, but no modification of the signal tuning pattern <am> has yet been made. This leads from the original reflection factor trace 71 to the spread 73 by adding the uncorrected vector <am*(1−Γ2)*(1−C)*S12> to each point of the trace 71 which has only shifted proportionally the phase and increased the amplitude of $\Gamma_{LOAD}$ i.e., simply augmented the tuning range, but has not redressed the spread of points. In FIG. 8 the complete hybrid modulated tuner is shown in a dotted frame comprising a computer 89 controlling 82, 83 the passive tuner 84 and the active modulated tuner 80; the tuning pattern has been corrected in the active tuner 80 of FIG. 8 from the <am> of FIG. 6 to <amc>; this allows redressing the original uncorrected spread 73 into the narrow cluster of reflection factors 72, as follows: The modulated signal <b2> exiting from the DUT is sampled by the directional signal coupler 88 which has a forward coupling factor C (<<1) as well a smaller reverse leakage. The signal portion <C*b2> is injected into the input port 85 of the active tuner 80. This signal is processed as shown in FIGS. 5A and 5B. The returning signal <amc> is amplified by the amplifier 86 and injected into the idle port of tuner 84 via a circulator 87. Compared with the original signal <am> (FIG. 6)<amc> is corrected for the impedance pattern distortion (deformation), caused by the pre-matching tuner 84. To do so the s-parameters of the tuner 84 (at any user-defined state of the tuner) are transferred 81 to the active tuner 80 using the same procedure as when transferring the modulation pattern of the original signal, which is used to control the I and Q components 52, 53 of each vector 50 at a frequency Fi in the modulation band 54 around the center frequency Fc (FIG. 5B), by re-programming the numeric processor (FPGA) and creating new vector 51 at will, and redressing the originally spread reflection factors from trace 71 to cluster 70 or from trace 73 to cluster 72.

The modulated signal <amc> exiting from port 2 of the circulator 87 is reflected back at the idle port of the tuner 84; the reflection factor Γ2 is close but not equal to S22 of the tuner, because the test port of the tuner is not terminated with Zo. The remaining signal <amc*(1−Γ2)> enters the tuner 84 and exits from the test port multiplied by the transfer coefficient S12 to a total of <amc*(1−Γ2)*S12>; then a leakage portion (C1) is lost into the reverse port of the coupler, yielding a total freely programmable signal of <amc*(1−Γ2)*(1−C)*S12>, which is superimposed to the reflected signal at the passive tuner at the DUT port <b2* (1−C)$^2$*S11>≈<b2*(1−2C)*S11>, since C1. Compared with the situation of FIG. 2, the load reflection factor $\Gamma_{LOAD}$ has changed: In FIG. 2: $\Gamma_{LOAD}$=<a2>/<b2>=<am*(1−C)>/<b2> and in FIG. 8 $\Gamma_{LOAD}$=<amc*(1−Γ2)*(1−C)*S12+(1−2C) *S11>/<b2>; or the ratio between <am> and <amc> for creating the same kind of reflection factor clusters as 70 and 72 (albeit, in case of cluster 72, requiring less amplifier power, achieved by inserting the pre-matching tuner 84) is <amc>/<am>=(1−Γ2)*S12+(1−C)*S11; in this equation, assuming the coupling factor C to be less than −20 dB or <0.1 and the pre-matching tuner having a high |S11| (≈|S22|), then the relation between the original tuning pattern <am> and the corrected tuning pattern <amc> can be simplified to <amc>≈<am>*(1−S22)*S12+S11 {eq. 1} or, assuming |S22|≈|Γ2|>0.8 and S12<0.3, this relation can be approximated by <amc>≈<am>*S11 {eq. 2}.

In practice these operations resume in the following steps: first the s-parameters of the passive load pull tuner are retrieved from a calibration file at a frequency F; then the deformation (distortion) of the frequency modulation pattern is calculated, caused by inserting the s-parameters of the passive load pull tuner, and last the FPGA is re-programmed to revert the said deformation (distortion).

Therefore, the modulation pattern correction procedure must acquire the s-parameters {Sij} of the calibrated pre-matching tuner at its specific tuning state and use them to modify the original objective at the active tuner level. The calibration of the passive tuner consists of measuring scattering (s-) parameters for a multitude M>1 of settings at the number of 2N+1 frequencies Fc . . . Fc±N*dF, covering the modulation band 2N*dF around the center frequency Fc, using a vector network analyzer (VNA) and saving in tuner calibration files, comprising the tuner states and associated s-parameters for each frequency. This can be done either in a multitude of calibration files (one file per frequency) or a larger file with blocks for each frequency.

This modification's original objective at the active tuner level can only be executed via the controlling computer 89, which communicates with and can program the numeric processor of the active tuner 80 and also controls the pre-matching tuner 84. This procedure retrieves s-parameters of the passive load pull from the tuner calibration file at the frequency Fi, embed (cascade with . . . ) the s-parameters for each frequency Fi of the original modulation pattern of the frequency modulated signal, resulting in the deformed (distorted) frequency modulation pattern, and re-program the FPGA to modify amplitude and phase of the frequency components Fi of the injected signal in order to reverse to the original modulation pattern and synthesize arbitrary impedances using the original frequency modulation pattern.

In the process, tuner calibrated {Sij} for each frequency Fi and for each calibrated tuning probe position allow calculating s-parameters for each intermediate tuning probe position; the controller 89 is also capable of modifying the programming of the numeric processor (FPGA) to include the s-parameter information per the formula {1}. This relation serves as a rough pre-set estimate and starting point of an optimization tuning loop, possible, because in any case the real setup includes real-time measuring the actual load reflection factor using a vector network analyzer (VNA). Without this realistic optimization starting point, the optimization routine often fails to produce tangible results. As shown in FIG. 10 of ref. 6, included here as prior art FIG. 9, the real time forward and reverse power waves <a> and <b> towards and from the DUT 206 are measured by the Oscilloscope 242 (or a VNA) via the directional couplers 243a, 243b and 244a, 244b and the tuning is fine adjusted by controlling the vectors 52, 53 and 51 (FIG. 5B) generated by the active tuner 80. Real time tuning is a prior art technology, which uses Error Function and gradient search and optimization algorithms known in the art.

This invention discloses an improved pre-matched active modulated tuner for load pull testing microwave transistors subject to modulated signal stimulus. A modulation correction method uses passive tuner calibration data to modify the numeric processor of the active tuner and allow precise tuning using optimization with a realistic starting point.

What is claimed is:

1. A hybrid load pull tuner for a modulated signal, comprising:
   a) a passive pre-matching load pull tuner having a test port and an idle port, and
   b) an active tuner injecting a signal modulated using a modulation pattern into an output port of a DUT;
   wherein
   the active tuner includes:
   b1) a signal processing module having an input port and comprising:
   a cascade of an analog to digital (ADC) converter, a field programmable gate array (FPGA) and a digital to analog converter (DAC),
   the cascade of the ADC, FPGA and DAC being inserted between a down-conversion stage and an up-conversion stage and is driven by a local oscillator;
   b2) a directional signal coupler having an input, an output, a coupled and an isolated port;
   b3) a circulator having ports #1, #2 and #3, and
   b4) an amplifier having an input port and an output port;
   wherein
   the directional signal coupler is inserted between the output port of the DUT and the test port of the passive load pull tuner;
   the coupled port of the directional signal coupler is connected with the input port of the signal processing module;
   the up-conversion stage of the signal processing module is connected with the input port of the amplifier;
   the output port of the amplifier is connected with port #1 of the circulator;
   port #2 of the circulator is connected with the idle port of the passive load pull tuner;
   c) a method for modifying a configuration of the FPGA, based on s-parameters of the passive load pull tuner, said method comprising:
   retrieving s-parameters of the passive load pull tuner from a tuner calibration file at a frequency F,
   calculating a deformation (distortion) of an impedance pattern caused by inserting the passive load pull tuner between port #2 of the circulator and the output port of the directional signal coupler, and
   re-programming the FPGA to revert the deformation (distortion).

2. The hybrid load pull tuner for the modulated signal of claim 1, wherein,
   the modulated signal injected into the DUT comprises a modulation of the frequency F including a multitude of $2N+1$ frequency components $F_i$ forming a frequency modulation band around a center frequency $F_c$ as follows:
   $F_c - i*dF \leq F \leq F_c + i*dF$, wherein $i=, 2, 3, \ldots N$, $N>1$ and $dF$ is the distance between adjacent frequency components $F_i$.

3. A characterization method (calibration) of the passive load pull tuner of the hybrid load pull tuner for the modulated signal of claim 2, comprising measuring scattering (s-) parameters of the passive load pull tuner using a vector network analyzer (VNA) for a multitude $M>1$ of settings at the number of $2N+1$ frequencies $F_i = F_c + i*dF$, with $-N \leq i \leq N$, $N \geq 1$, covering the modulation band $2N*dF$ around the center frequency $F_c$, and saved in tuner calibration file(s).

4. The method for correcting the deformation (distortion) of the impedance pattern of the hybrid load pull tuner for the modulated signal of claim 3, using re-programming the FPGA and creating a corrected modulation pattern of the injected modulated signal, at frequencies $F_i = F_c + i*dF$ with $-N \leq i \leq N$, as follows:
   (i) retrieve s-parameters of the passive load pull from the tuner calibration file(s) at the frequency $F_i$,
   (ii) embed the s-parameters retrieved at step (i) for each frequency $F_i$ of an original impedance pattern of the frequency modulated signal, resulting in a deformed (distorted) impedance pattern, and
   (iii) re-program the FPGA to modify amplitude and phase of the frequency components $F_i$ of the injected signal in order to reverse to the original impedance pattern.

5. The hybrid load pull tuner for the modulated signal of claim 1,
   wherein
   the isolated port of the directional signal coupler and port #3 of the circulator are terminated with a characteristic impedance $Z_o = 50$ Ohms.

* * * * *